US012336413B2

(12) United States Patent
Wen et al.

(10) Patent No.: US 12,336,413 B2
(45) Date of Patent: Jun. 17, 2025

(54) DISPLAY PANEL, DISPLAY DEVICE, AND MANUFACTURING METHOD OF DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ping Wen, Beijing (CN); Shun Zhang, Beijing (CN); Yuanqi Zhang, Beijing (CN); Chang Luo, Beijing (CN); Wei Wang, Beijing (CN); Yu Wang, Beijing (CN); Tingliang Liu, Beijing (CN); Yang Zeng, Beijing (CN); Yi Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 378 days.

(21) Appl. No.: 17/786,391

(22) PCT Filed: Sep. 1, 2021

(86) PCT No.: PCT/CN2021/115874
§ 371 (c)(1),
(2) Date: Jun. 16, 2022

(87) PCT Pub. No.: WO2022/088942
PCT Pub. Date: May 5, 2022

(65) Prior Publication Data
US 2023/0012152 A1    Jan. 12, 2023

(30) Foreign Application Priority Data
Oct. 30, 2020    (CN) .......................... 202011194836.1

(51) Int. Cl.
*H10K 59/40*    (2023.01)
*G06F 3/041*    (2006.01)
(Continued)

(52) U.S. Cl.
CPC .......... *H10K 59/40* (2023.02); *G06F 3/0412* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS

2008/0018229 A1    1/2008    Yamazaki
2022/0045302 A1    2/2022    Ku et al.

FOREIGN PATENT DOCUMENTS

CN        1825616 A      8/2006
CN     202976052 U      6/2013
(Continued)

OTHER PUBLICATIONS

CN 202011194836.1, Notice of the First Examination Opinion, Nov. 14, 2024.

*Primary Examiner* — Anthony Ho
(74) *Attorney, Agent, or Firm* — The Webb Law Firm

(57) ABSTRACT

The present disclosure relates to a display panel, a display device and a manufacturing method of a display panel. The display panel includes: a display substrate having a display area and a non-display area, the display substrate including a substrate and an IC bonding portion which includes: a pin; a first passivation layer located on one side of the substrate adjacent to the pin and covering a peripheral area of the pin, and exposing a central area of the pin; a first barrier layer located on one side of the first passivation layer away from (Continued)

the substrate and covered at the first passivation layer and an edge of the first passivation layer connected to the pin; and a first metal layer located on one side of the first barrier layer away from the substrate, at least covering a central portion of the pin, and electrically connected to the pin.

14 Claims, 3 Drawing Sheets

(51) Int. Cl.
    *H01L 23/00*     (2006.01)
    *H01L 25/18*     (2023.01)
    *H10K 59/131*     (2023.01)
    *H10K 59/179*     (2023.01)
    *H10K 59/82*     (2023.01)
    *H10K 71/00*     (2023.01)
    *H10K 59/12*     (2023.01)

(52) U.S. Cl.
    CPC .............. *H01L 24/29* (2013.01); *H01L 24/32* (2013.01); *H01L 25/18* (2013.01); *H10K 59/131* (2023.02); *H10K 59/179* (2023.02); *H10K 59/82* (2023.02); *H10K 71/00* (2023.02); *H01L 2224/039* (2013.01); *H01L 2224/05018* (2013.01); *H01L 2224/05082* (2013.01); *H01L 2224/05558* (2013.01); *H01L 2224/05562* (2013.01); *H01L 2224/05573* (2013.01); *H01L 2224/29028* (2013.01); *H01L 2224/32145* (2013.01); *H10K 59/1201* (2023.02)

(56) References Cited

FOREIGN PATENT DOCUMENTS

| | | |
|---|---|---|
| CN | 107464828 A | 12/2017 |
| CN | 108615750 A | 10/2018 |
| CN | 108962917 A | 12/2018 |
| CN | 109309101 A | 2/2019 |
| CN | 109427689 A | 3/2019 |
| CN | 110890409 A | 3/2020 |
| CN | 110970484 A | 4/2020 |
| CN | 210377421 U | 4/2020 |
| CN | 210429887 U | 4/2020 |
| CN | 111477675 A | 7/2020 |
| CN | 111524908 A | 8/2020 |
| CN | 111627965 A | 9/2020 |
| CN | 111755463 A | 10/2020 |
| CN | 111785757 A | 10/2020 |
| CN | 113053923 A | 6/2021 |
| CN | 214505497 U | 10/2021 |
| KR | 1020200061757 A | 6/2020 |
| WO | 2019114062 A1 | 6/2019 |
| WO | 2019242083 A1 | 12/2019 |

DISPLAY PANEL, DISPLAY DEVICE, AND MANUFACTURING METHOD OF DISPLAY PANEL

CROSS-REFERENCE TO RELATED APPLICATIONS

The present application is a U.S. National Phase of International Patent Application No. PCT/CN2021/115874, filed on Sep. 1, 2021, which claims priority to China-Chinese Patent Application No. 202011194836.1 filed on Oct. 30, 2020, the disclosure of both which are hereby incorporated herein in their entirety.

TECHNICAL FIELD

The present disclosure relates to the field of display technology, and in particular, to a display panel, a display device, and a manufacturing method of a display panel.

BACKGROUND

In some related technologies of the organic light-emitting diode (simply referred to as OLED) display devices, a touch control element is arranged between the display substrate with a accomplished thin film encapsulation (simply referred to as TFE) process and the cover plate glass, by using a flexible multi-layer On Cell (simply referred to as FMLOC) method. The bonding pad in the bonding area of the integrated circuit chip of this display panel (i.e., IC bonding area) is coated with an organic material film layer, such as a planarization layer (simply referred to as PLN) or a pixel definition layer (simply referred to as PDL).

SUMMARY

According to one aspect of the present disclosure, a display panel is provided. The display panel includes: a display substrate having a display area and a non-display area surrounding the display area, wherein the display substrate including a substrate and an integrated circuit (simply referred to as IC) bonding portion arranged on one side of the substrate and located in the non-display area, and wherein the IC bonding portion includes: a pin; a first passivation layer located on one side of the substrate adjacent to the pin, covering a peripheral area of the pin, and exposing a central area of the pin; a first barrier layer located on one side of the first passivation layer away from the substrate and covering the first passivation layer and an edge of the first passivation layer connected to the pin; and a first metal layer located on one side of the first barrier layer away from the substrate, at least covering a central portion of the pin, and electrically connected to the pin.

In some embodiments, the display panel further includes: an IC chip having a chip base pin, wherein the IC chip is located on one side of the first metal layer away from the substrate; and a conductive adhesive film located between the chip base pin of the IC chip and the first metal layer, and electrically connected to the chip base pin of the IC chip and the first metal layer.

In some embodiments, the display panel further includes: a touch control structure at least located in the display area of the display substrate; wherein the display substrate further includes: a plurality of light-emitting elements arranged on one side of the substrate adjacent to the IC bonding portion and located in the display area; and an encapsulation layer located between the plurality of light-emitting elements and the touch control structure, and configured to encapsulate the display substrate.

In some embodiments, the touch control structure includes: a second barrier layer located on one side of the encapsulation layer away from the substrate and covering a surface of the encapsulation layer.

In some embodiments, the touch control structure further includes: a first touch control electrode layer having a first touch control electrode pattern and located on one side of the second barrier layer away from the substrate; a touch control insulating layer having a touch control insulating pattern and located on one side of the first touch control electrode layer away from the substrate; and a second touch control electrode layer having a second touch control electrode pattern and located on one side of the touch control insulating layer away from the substrate, wherein part of the second touch control electrode pattern is electrically connected to the first touch control electrode pattern through a via hole penetrating through the touch control insulating layer.

In some embodiments, the touch control structure further includes: an insulating protection layer having an insulating protection pattern, and located on one side of the second touch control electrode layer away from the substrate, and configured to perform insulation protection on the second touch control electrode layer.

In some embodiments, the second barrier layer and the first barrier layer are located in the same layer and formed of the same material.

In some embodiments, the touch control insulating layer and the first barrier layer are located in the same layer and formed of the same material, and the second touch control electrode layer and the first metal layer are located in the same layer and formed of the same material.

In some embodiments, the display substrate further includes: a first insulating layer located between the first passivation layer and the substrate; and a second insulating layer located between the first insulating layer and the first passivation layer, wherein the pin includes: a first pin metal layer located on a surface of one side of the first insulating layer away from the substrate, and partially covered by the second insulating layer.

In some embodiments, the display substrate further includes: a third insulating layer located between the second insulating layer and the first passivation layer, wherein the pin further includes: a second pin metal layer located on a surface of one side of the third insulating layer away from the substrate, and electrically connected to the first pin metal layer through a via hole penetrating through the second insulating layer and the third insulating layer, wherein the second pin metal layer is also electrically connected to the first metal layer.

In some embodiments, the display substrate further includes: a thin film transistor device including an active layer, a gate, a source and a drain, wherein the active layer is located between the first insulating layer and the substrate, the gate is located on a surface of one side of the first insulating layer away from the substrate, and the source and the drain are located on a surface of one side of the third insulating layer away from the substrate, and electrically connected to the active layer through via holes penetrating through the first insulating layer, the second insulating layer and the third insulating layer respectively; and a capacitor device including a first capacitor electrode plate and a second capacitor electrode plate, wherein the first capacitor electrode plate is located on a surface of one side of the first insulating layer away from the substrate, and the second capacitor electrode plate is located on a surface of one side of the second insulating layer away from the substrate; wherein the gate, the first capacitor electrode plate and the first pin metal layer are located in the same layer and formed of the same material, and the source, the drain and the second pin metal layer are located in the same layer and formed of the same material.

In some embodiments, the display substrate further includes: a second passivation layer located on one side of the third insulating layer away from the substrate and covering the source and the drain; and a planarization layer located on one side of the second passivation layer away from the substrate, wherein the plurality of light-emitting elements are located between the planarization layer and the encapsulation layer, and the second passivation layer and the first passivation layer are located in the same layer and formed of the same material.

In another aspect of the present disclosure, a display device is provided. The display device includes the display panel described above.

In a further aspect of the present disclosure, a manufacturing method of a display panel is provided. The method includes: forming a display substrate having a display area and a non-display area surrounding the display area, wherein the display substrate includes a substrate and an IC bonding portion formed on one side of the substrate and located in the non-display area, wherein a step of forming the IC bonding portion includes: forming a pin on one side of the substrate; forming a first passivation layer on one side of the substrate adjacent to the pin and causing the first passivation layer to cover a peripheral area of the pin, and to expose a central area of the pin; forming a first barrier layer on one side of the first passivation layer away from the substrate, and causing the first barrier layer to cover the first passivation layer and an edge of the first passivation layer connected to the pin; and forming a first metal layer on one side of the first barrier layer away from the substrate, and causing the first metal layer to at least cover a central portion of the pin and to electrically connect the pin.

In some embodiments, the manufacturing method further includes between the step of forming the first passivation layer and the step of forming the first barrier layer: forming a planarization layer on one side of the first passivation layer away from the substrate; and removing at least a portion of the planarization layer corresponding to the pin.

BRIEF DESCRIPTION OF THE
ACCOMPANYING DRAWINGS

The accompanying drawings which constitute part of this specification, illustrate the exemplary embodiments of the present disclosure, and together with this specification, serve to explain the principles of the present disclosure.

The present disclosure may be more explicitly understood from the following detailed description with reference to the accompanying drawings, in which.

Figure 1:
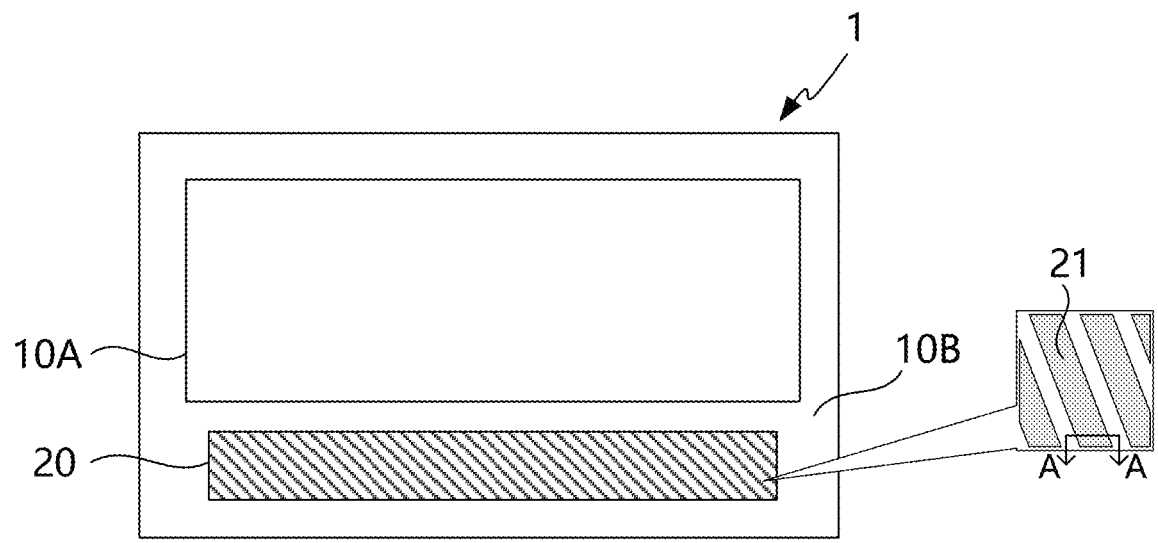
FIG. 1 is a partial schematic view of an overall layout of a display substrate and part of an IC bonding portion in an embodiment of the display panel according to the present disclosure.

It should be understood that the dimensions of various parts shown in the accompanying drawings are not drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In some related technologies, the pin at a bonding portion of the IC bonding area in the display substrate is coated by an organic material film layer (for example, a planarization layer). It has been found through studies that, in the FMLOC process, when a barrier layer is formed in the IC bonding area, there is a poor adhesive force between the barrier layer and the organic material film layer. Moreover, the edge portion of the organic material film layer that is not coated by the barrier layer is exposed. This makes the organic material film to be prone to absorb water in the water washing step of the FMLOC process. Further, when the display substrate is subjected to related tests subsequently, for example a reliability test of high temperature and high humidity, the moisture absorbed within the organic material film layer thermally expands, which may result in peel-off of the barrier layer and the metal layer of the IC bonding area.

In other related technologies, when the barrier layer is formed, the barrier layer covers the edge portion of the organic material film layer, so that the edge portion is not exposed. It has been found through studies that, when such structure is used, the metal layer coated on the pin at a bonding portion of the IC bonding area may also cover the barrier layer coated with the organic material film layer, so that there is height difference as much as 1.2 µm between the edge area and the central area that is not coated with the barrier layer and the organic material film layer. In this way, when electrical connection between the metal layer and the base pin of the IC chip is realized through the anisotropic conductive film (simply referred to as ACF), the conductive particles in the edge area of the ACF corresponding to the metal layer which are subjected to a great force are likely to fracture the barrier layer, which causes that the organic material film layer is prone to absorb water through a crack of the barrier layer in the water washing step of the FMLOC process. Further, when the display substrate is subjected to related tests subsequently, for example a reliability test of high temperature and high humidity, the moisture absorbed within the organic material film layer thermally expands, which may result in peel-off of the barrier layer and the metal layer of the IC bonding area.

In view of this, the embodiments of the present disclosure provide a display panel, a display device, and a manufacturing method of a display panel, which can improve poor circumstances such as peel-off of the barrier layer and the metal layer of the IC bonding area.

Figure 2:
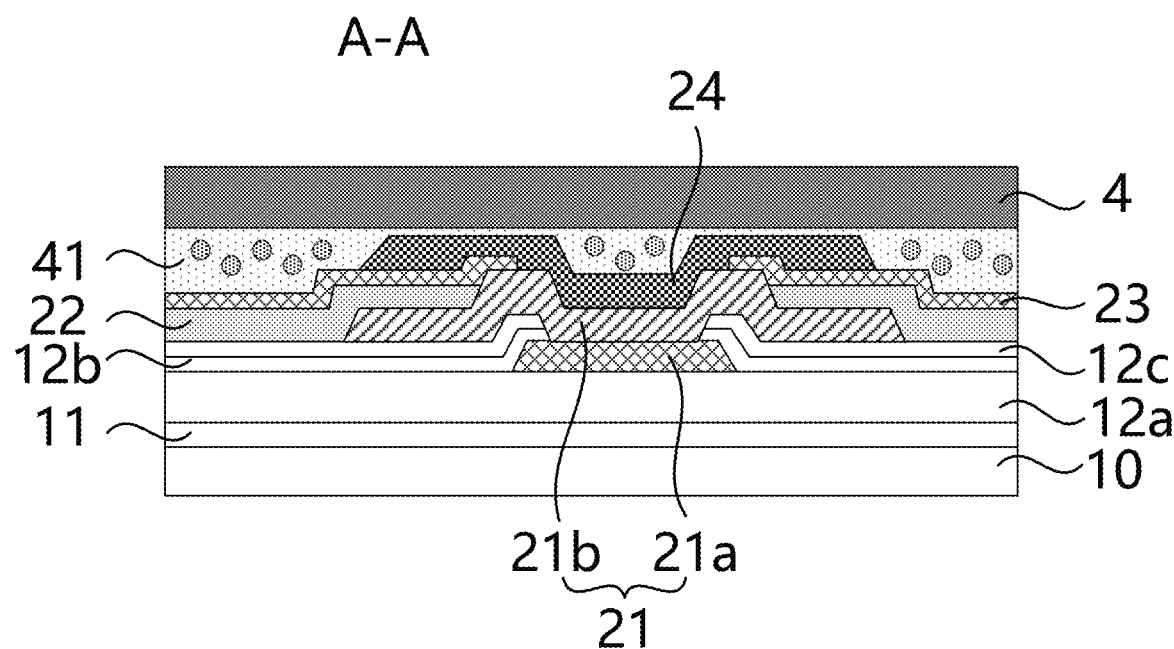
FIG. 2 is an AA cross-sectional structural view of an area where an IC bonding portion is located in an embodiment of the display panel according to the present disclosure.

FIG. 1 is a partial schematic view of an overall layout of a display substrate and an IC bonding portion in an embodiment of the display panel according to the present disclosure. FIG. 2 is an AA cross-sectional structural view of an area where an IC bonding portion is located in an embodiment of the display panel according to the present disclosure.

Referring to FIG. 1, in some embodiments, the display panel includes a display substrate 1. The display substrate 1 has a display area 10A and a non-display area 10B surrounding the display area 10A. The display area 10A is configured to display images, and the non-display area 10B is configured to arrange related circuits and related electronic elements so as to support the display of the display area 10A.

The display area 10A is not limited to be in a specific shape, for example, circular, elliptical, polygonal, and the like. Referring to FIG. 1, in some embodiments, the display area 10A is substantially polygonal, for example substantially rectangular as shown in FIG. 1. Here, that the display area 10A is substantially polygonal may be understood that: after the fillet, chamfer or process errors of the display area are omitted, the display area 10A has a polygonal shape.

In FIG. 1, the display substrate 1 includes a substrate 10 and an IC bonding portion 20 provided on one side of the substrate 10 and located in the non-display area 10B. The IC bonding portion 20 is configured to connect a base pin of the IC chip that may provide drive signals, data signals, clock signals or the like to the display pixels in the display substrate, and provide detection signals or the like to the display substrate.

In some embodiments, the display substrate 1 is an active matrix organic light-emitting diode (AMOLED) display substrate or a passive matrix organic light-emitting diode (PMOLED) display substrate. For example, when the display substrate 10 is an AMOLED display substrate, its substrate 10 may be a flexible substrate (for example, a polyimide material) or a hard substrate (for example, a glass or resin material).

In FIG. 2, the IC bonding portion 20 includes: a pin 21, a first passivation layer (PVX) 22, a first barrier layer 23 and a first metal layer 24. The first passivation layer 22 is located on one side of the substrate 10 adjacent to the pin 21, and covering a peripheral area of the pin 21, and exposing a central area of the pin 21. The first passivation layer 22 may be formed of an inorganic material, for example, a compound of silicon such as silicon oxide SiOx, silicon nitride SiNx, or silicon oxynitride SiNO.

The first barrier layer 23 is located on one side of the first passivation layer 22 away from the substrate 10, and covering the passivation layer 22 and an edge of the first passivation layer 22 connected to the pin 21. The first barrier layer 23 may be formed of an insulating material, such as silicon nitride SiNx. The first metal layer 24 is located on one side of the first barrier layer 23 away from the substrate 10, at least covering a central portion of the pin 21, and electrically connected to the pin 21.

Compared with the structure that a peripheral area of the pin is coated by an organic material film layer such as a planarization layer in the IC bonding area in the related art, in this embodiment, since a peripheral area of the pin 21 is coated by the first passivation layer 22, the adhesive force between the first passivation layer 22 and the first barrier layer 23 is better than the adhesive force between the organic material film layer and the barrier layer in the related art, so that it is not prone to peel off from the first passivation layer 22, and it is also possible to avoid that the organic material film layer absorbs water vapor and thermally expands and thus results in the circumstance of peel-off of the barrier layer and the metal layer, and further cause that the first barrier layer 23 and the first metal layer 24 in the IC bonding portion are less prone to peel off.

Referring to FIG. 2, in some embodiments, the display panel further includes: an IC chip 4 and a conductive adhesive film 41. The IC chip 4 has chip base pin 42, and the IC chip 4 is located on one side of the first metal layer 24 away from the substrate 10. The conductive adhesive film 41 is located between the chip base pin 42 of the IC chip 4 and the first metal layer 24, and electrically connected to the chip base pin 42 of the IC chip 4 and the first metal layer 24. The conductive adhesive film 41 may be formed of ACF.

Compared with the structure in which the edge portion of the organic material film layer is coated by the barrier layer and the metal layer is connected to the base pin of the IC chip by ACF in the related art, in this embodiment, the first barrier layer 23 directly covers the first passivation layer. Therefore, the height difference between the edge and the center of the first metal layer 24 formed on the first barrier layer 23 and the IC chip 4 is relatively small, which causes that the conductive particles of the conductive adhesive film 41 corresponding to the edge position are subject to a relatively small force, so that it is not likely to fracture the first barrier layer 23. On the other hand, it is also possible to avoid that the organic material film layer absorbs water vapor through a crack of the barrier layer and thermally expands, and thus results in the circumstance of peel-off of the barrier layer and the metal layer, which further causes that the first barrier layer 23 and the first metal layer 24 in the IC bonding portion 24 are less prone to peel off.

In FIG. 2, the display substrate further includes: a first insulating layer 12a and a second insulating layer 12b. The first insulating layer 12a is located between the first passivation layer 22 and the substrate 10. The second insulating layer 12b is located between the first insulating layer 12a and the first passivation layer 22.

The materials of the first insulating layer (for example, the first gate insulating layer GI1) 12a and the second insulating layer (for example, the second gate insulating layer GI2) 12b may include silicon compounds or metal oxides, for example, silicon oxynitride SiNO, silicon oxide SiOx, silicon nitride SiNx, silicon oxycarbide SiCxOy, silicon carbonitride SiCxNy, aluminum oxide AlOx, aluminum nitride AlNx, tantalum oxide TaOx, hafnium oxide HfOx, zirconium oxide ZrOx, titanium oxide TiOx, and the like. The first insulating layer 12a and the second insulating layer 12b may be a single layer or multiple layers.

The pin 21 in the IC bonding portion 20 may be formed synchronously during the process of forming the display pixels in the display substrate 1. Referring to FIG. 2, in some embodiments, the pin 21 includes a first pin metal layer 21a. The first pin metal layer 21a is located on a surface of one side of the first insulating layer 12a away from the substrate 10, and partially covered by the second insulating layer 12b.

Referring to FIG. 2, in some embodiments, the display substrate further includes a third insulating layer 12c. The third insulating layer 12c is located between the second insulating layer 12b and the first passivation layer 22. The materials of the third insulating layer (for example, the interlayer insulating layer ILD) 12c may include silicon compounds, metal oxides, and the like. Specifically, the silicon compounds and metal oxides listed above may be selected, and thus will not be described in detail here.

In FIG. 2, the pin 21 further includes a second pin metal layer 21b. The second pin metal layer 21b is located on a surface of one side of the third insulating layer 12c away from the substrate 10, and electrically connected to the first pin metal layer 21a through a via hole penetrating through the second insulating layer 12b and the third insulating layer 12c. The second pin metal layer 21b is also electrically connected to the first metal layer 24.

Figure 3:
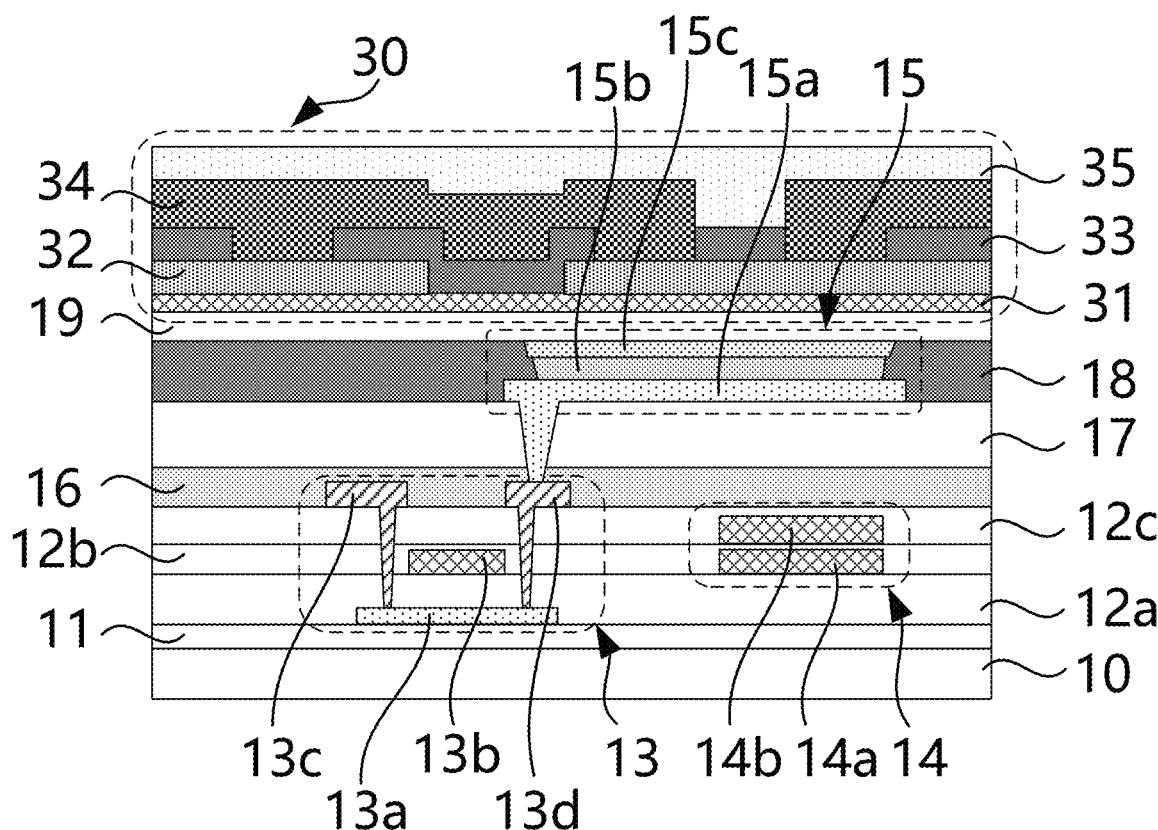
FIG. 3 is a schematic cross-sectional structural view of a display area in an embodiment of the display panel according to the present disclosure.

FIG. 3 is a schematic cross-sectional structural view of a display area in an embodiment of the display panel according to the present disclosure.

Referring to FIG. 3, in some embodiments, the display panel further includes a touch control structure 30. The touch control structure 30 is formed on the display substrate 1 by the foregoing FMLOC process. The touch control structure 30 is located at least in the display area 10A of the display substrate 1. In some embodiments, the touch control structure 30 is located in the display area 10A. In other embodiments, the touch control structure 30 is located in the display area 10A and the non-display area 10B.

For the touch control structure 30 formed by the FMLOC process, since the display substrate is required to be water washed before each photo mask process in its process, the organic material film layer in the IC bonding area in the related art is prone to absorb water during the water washing process. Further, the first passivation layer 22 covers a peripheral area of the pin 21, so that the IC bonding portion in this embodiment avoids the problem that the organic material is prone to absorb water when the pin is coated by the organic material film layer.

In FIG. 3, the display substrate 1 further includes: a plurality of light-emitting elements 15 and an encapsulation layer 19. A plurality of light-emitting elements 15 are provided on one side of the substrate 10 adjacent to the IC bonding portion 20 and located in the display area 10A. For an AMOLED display substrate, the display substrate 1 may further include a thin film transistor device 13 and a capacitor device 14. The thin film transistor device 13 is electrically connected to the light-emitting element 15 so as to control the light-emitting elements 15 to cause each light-emitting element 15 to emit light independently.

The thin film transistor device 13 may include an active layer 13a, a gate 13b, a source 13c and a drain 13d. The active layer 13a is located between the first insulating layer 12a and the substrate 10, the gate 13b is located on a surface of one side of the first insulating layer 12a away from the substrate 10, the source 13c and the drain 13d are located on a surface of one side of the third insulating layer 12c away from the substrate 10, and respectively electrically connected to the active layer 13a through a via hole penetrating through the first insulating layer 12a, the second insulating layer 12b and the third insulating layer 12c.

The materials of the active layer 13a may include inorganic semiconductor materials (for example, polycrystalline silicon or amorphous silicon, and the like), organic semiconductor materials, or oxide semiconductor materials. The materials of the gate 13b may include metals, metal alloys, metal nitrides, conductive metal oxides or transparent conductive materials and the like, such as silver, copper, aluminum alloy, aluminum nitride, tin oxide, indium tin oxide, and the like. The materials of the source 13c and the drain 13d may include metals, alloys, metal nitrides, conductive metal oxides, or transparent conductive materials and the like, for example, multi-layer metals Mo—Al—Mo or Ti—Al—Ti.

The capacitor device 14 may include a first capacitor electrode plate 14a and a second capacitor electrode plate 14b, wherein the first capacitor electrode plate 14a is located on a surface of one side of the first insulating layer 12a away from the substrate 10, and the second capacitor electrode plate 14a is located on a surface of one side of the second insulating layer 12b away from the substrate 10.

In some embodiments, the gate 13b, the first capacitor electrode plate 14a and the first pin metal layer 21a are located in the same layer and formed of the same material, which is conductive to forming the gate 13b, the first capacitor electrode plate 14a and the first pin metal layer 21a by the same patterning process, thereby simplifying the process. In some embodiments, the source 13c, the drain 13d and the second pin metal layer 21b are located in the same layer and formed of the same material, which is conductive to forming the source 13c, the drain 13d and the second pin metal layer 21b by the same patterning process, thereby simplifying the process.

The structure of the same layer and formed of the same material mentioned here and later may be a layer structure formed by using the same film forming process to form a film layer with a specific pattern, and then using the same mask to pattern the film layer by a single patterning process. Depending on different specific patterns, a single patterning process may include multiple exposure, development or etching processes, and the specific pattern in the formed layer structure may be continuous or discontinuous. These specific patterns may also be at different heights or have different thicknesses.

In FIGS. 2 and 3, a buffer layer 11 may also be provided between the first insulating layer 12a and the substrate 10. The buffer layer 11 is configured to prevent or reduce the diffusion of metal atoms or impurities from the substrate into the active layer of the transistor. The buffer layer 11 may include inorganic materials such as silicon oxide SiOx, silicon nitride SiNx, or silicon oxynitride SiNO, and may be formed as a single layer or multiple layers.

Referring to FIG. 3, in some embodiments, the display substrate 1 further includes: a second passivation layer 16 and a planarization layer 17. The second passivation layer 16 is located on one side of the third insulating layer 12c away from the substrate 10 and covering the source 13c and the drain 13d. In some embodiments, the second passivation layer 16 and the first passivation layer 22 are located in the same layer and formed of the same material, which is conductive to forming by the same patterning process, thereby simplifying the process.

The planarization layer 17 is located on one side of the second passivation layer 16 away from the substrate 10. A plurality of light-emitting elements 15 are located between the planarization layer 17 and the encapsulation layer 19. The materials of the planarization layer may include organic insulating materials, for example resin materials such as polyimide, epoxy resin, acrylic, polyester, photoresist, polyacrylate, polyamide and siloxane, and elastic materials such as urethane and thermoplastic polyurethane.

When the planarization layer 17 is formed, the planarization layer 17 may also be formed on the IC bonding area, for example, on a surface of one side of the first passivation layer 22 away from the substrate 10. In order to avoid the problem that the planarization layer including an organic material is prone to absorb water in the related art, it is possible to remove a portion of the planarization layer 17 at least corresponding to the pin 21 by an etching process or the like.

Referring to FIG. 3, the light-emitting element 15 may be an OLED light-emitting element. The light-emitting element may include a first electrode layer 15a, an organic light-emitting layer 15b, and a second electrode layer 15c. The first electrode layer 15a is located between the planarization layer 17 and the pixel definition layer 18, the organic light-emitting layer 15b is located within the pixel opening defined by the pixel definition layer 18, and the second electrode layer 15c is located on one side of the organic light-emitting layer 15b away from the substrate 10. The first electrode layer 15a may be electrically connected to the drain 13d through a via hole penetrating through the planarization layer 17 and the second passivation layer 16.

In some embodiments, the first electrode layer 15a serves as an anode layer of the light-emitting element 15, and the second electrode layer 15c serves as a cathode of the light-emitting element 15. Both the first electrode layer 15a and the second electrode layer 15b may be formed of materials such as metals, metal alloys, metal nitrides, conductive metal oxides or transparent conductive materials. The organic light-emitting layer 15b may include small molecular organic materials or polymer molecular organic materials, such as fluorescent light-emitting materials or phosphorescent light-emitting materials, which may emit red light, green light, blue light or white light.

Referring to FIG. 3, in some embodiments, the touch control structure 30 includes a second barrier layer 31. The second barrier layer 31 is located on one side of the encapsulation layer 19 away from the substrate 10, and covering the surface of the encapsulation layer 19. In some embodiments, the second barrier layer 31 and the first barrier layer 23 are located in the same layer and formed of the same material, which are conductive to forming the second barrier layer 31 and the first barrier layer 23 by the same patterning process, thereby simplifying the process.

Referring to FIG. 3, in some embodiments, the touch control structure 30 includes a first touch control electrode layer 32. The first touch control electrode layer 32 has a first touch control electrode pattern (TSP Metal A, simply referred to as TMA), and is located on one side of the second barrier layer 31 away from the substrate 10. The materials of the first touch control electrode layer 32 may include metals, alloys, metal nitrides, conductive metal oxides, or transparent conductive materials, for example, multi-layer metals Mo—Al—Mo or Ti—Al—Ti.

The first touch control electrode pattern may be configured to form a lower-layer passage of a bridge area, and may also be used for a longitudinal access of the touch control driving electrodes TX located at the periphery and the latitudinal access of the touch control sensing electrode RX signal trace. In other embodiments, the touch control driving electrodes TX and the touch control sensing electrodes RX may be arranged horizontally and vertically respectively, or arranged in other manners as needed.

In FIG. 3, the touch control structure 30 further includes: a touch control insulating layer 33 and a second touch control electrode layer 34. The touch control insulating layer 33 has a touch control insulating pattern, and is located on one side of the first touch control electrode layer 32 away from the substrate 10. The materials of the touch control insulating layer 33 may include inorganic materials, such as silicon oxide SiOx, silicon nitride SiNx, or silicon oxynitride SiNO, which may serve as an interlayer dielectric layer to produce an insulating effect. In some embodiments, the touch control insulating layer 33 and the first barrier layer 23 are located in the same layer and formed of the same material, which are conductive to forming the touch control insulating layer 33 and the first barrier layer 23 by the same patterning process, thereby simplifying the process.

The second touch control electrode layer 34 has a second touch control electrode pattern (TSP Metal B, simply referred to as TMB), and is located on one side of the touch control insulating layer 33 away from the substrate 10. Part of the second touch control electrode pattern electrically is connected to the first touch control electrode pattern through a via hole penetrating through the touch control insulating layer 33. The second touch control electrode pattern may be configured to form an upper-layer passage of a bridge area, and may also be configured to form metal mesh electrodes beyond the bridge area and signal traces located at the periphery. In some embodiments, the second touch control electrode layer 34 and the first metal layer 24 are located in the same layer and formed of the same material, which is conductive to forming the second touch control electrode layer 34 and the first metal layer 24 by the same patterning process, thereby simplifying the process.

Referring to FIG. 3, in some embodiments, the touch control structure 30 further includes an insulating protection layer 35. The insulating protection layer 35 has an insulating protection pattern, and is located on one side of the second touch control electrode layer 34 away from the substrate 10, and configured to perform insulation protection on the second touch control electrode layer 34. The materials of the insulating protection layer 35 may include inorganic insulating materials or organic insulating materials, such as polyimide.

The above-described embodiments of the display panel according to the present disclosure may be applied to various types of display devices. Therefore, the present disclosure also provides a display device including the foregoing display panel. The display device may be any product or member with a display function, such as a mobile phone, a tablet computer, a TV, a monitor, a notebook computer, a digital photo frame, a navigator, and the like.

Figure 4:
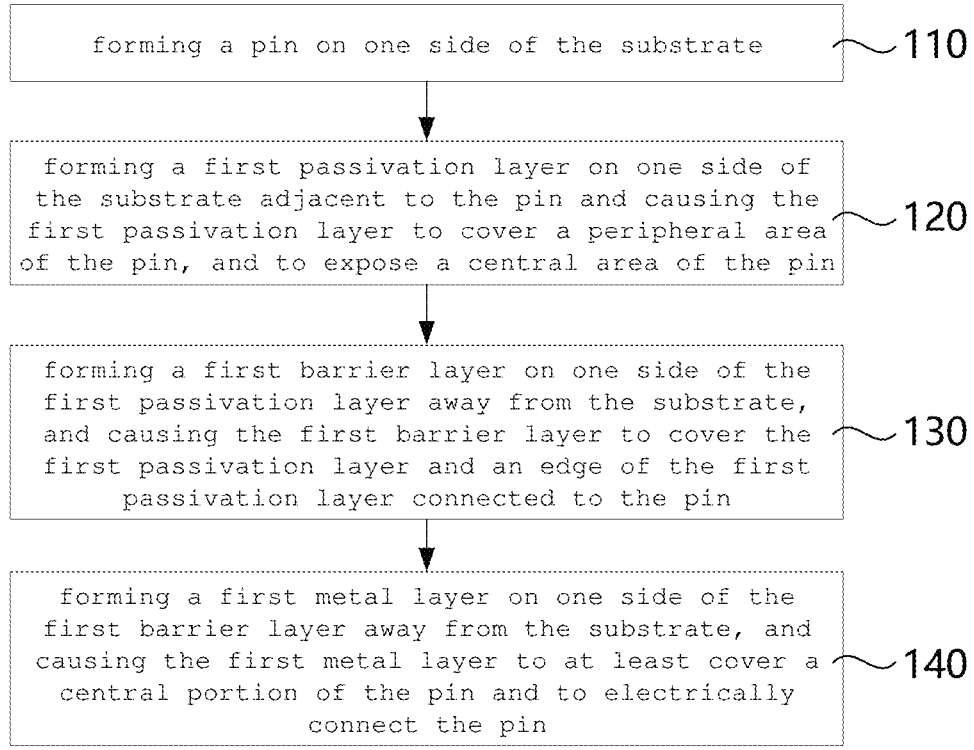
FIG. 4 is a schematic flowchart of forming an IC bonding portion in an embodiment of a manufacturing method of a display panel according to the present disclosure.

FIG. 4 is a schematic flowchart of forming an IC bonding portion in an embodiment of a manufacturing method of a display panel according to the present disclosure.

Refer to FIG. 4 and the foregoing embodiments of the display panel according to the present disclosure. In some embodiments, the manufacturing method of the display panel includes: forming a display substrate 1 having a display area 10A and a non-display area 10B surrounding the display area 10A, wherein the display substrate 1 includes a substrate 10 and an IC bonding portion 20 formed on one side of the substrate 10 and located in the non-display area 10B. During the process of forming the display substrate 1, the step of forming the IC bonding portion 20 may include steps 110 to 140.

Before step 110, the substrate 10 is first formed. In step 110, a pin 21 is formed on one side of the substrate 10. In step 120, a first passivation layer 22 is formed on one side of the substrate 10 adjacent to the pin 21, and the first passivation layer 22 is caused to cover a peripheral area of the pin 21, and to expose a central area of the pin 21.

In step 130, a first barrier layer 23 is formed on one side of the first passivation layer 22 away from the substrate 10, and the first barrier layer 23 is caused to cover the first passivation layer 22 and an edge of the first passivation layer 22 connected to the pin 21. In step 140, a first metal layer 24 is formed on one side of the first barrier layer 23 away from the substrate 10, and the first metal layer 24 is caused to at least cover a central portion of the pin 21, and to electrically connect the pin 21.

Compared with the structure that a peripheral area of the pin is coated by an organic material film layer such as a planarization layer in the IC bonding area in the related art, in this embodiment, since a peripheral area of the pin 21 is coated by the first passivation layer 22, the adhesive force between the first passivation layer 22 and the first barrier layer 23 is better than the adhesive force between the organic material film layer and the barrier layer in the related art, so that it is not prone to peel off from the first passivation layer 22, and it is also possible to avoid that the organic material film layer absorbs water vapor and thermally expands and thus results in peel-off of the barrier layer and the metal layer, and further cause that the first barrier layer 23 and the first metal layer 24 in the IC bonding portion are less prone to peel off.

In some embodiments, between the step 120 of forming the first passivation layer 22 and the step 130 of forming the first barrier layer 23 in FIG. 4, the method may further include: forming the planarization layer 17 on one side of the first passivation layer 22 away from the substrate 10; removing at least a portion of the planarization layer 17 corresponding to the pin 21. When the planarization layer is removed, the material of the planarization layer may be removed by means of laser or chemical etching. In other embodiments, after step 120, an opening position of the mask of the planarization layer may be provided so that the planarization layer does not cover the first passivation layer 22 and the pin 21 in the IC bonding area.

Figure 5:
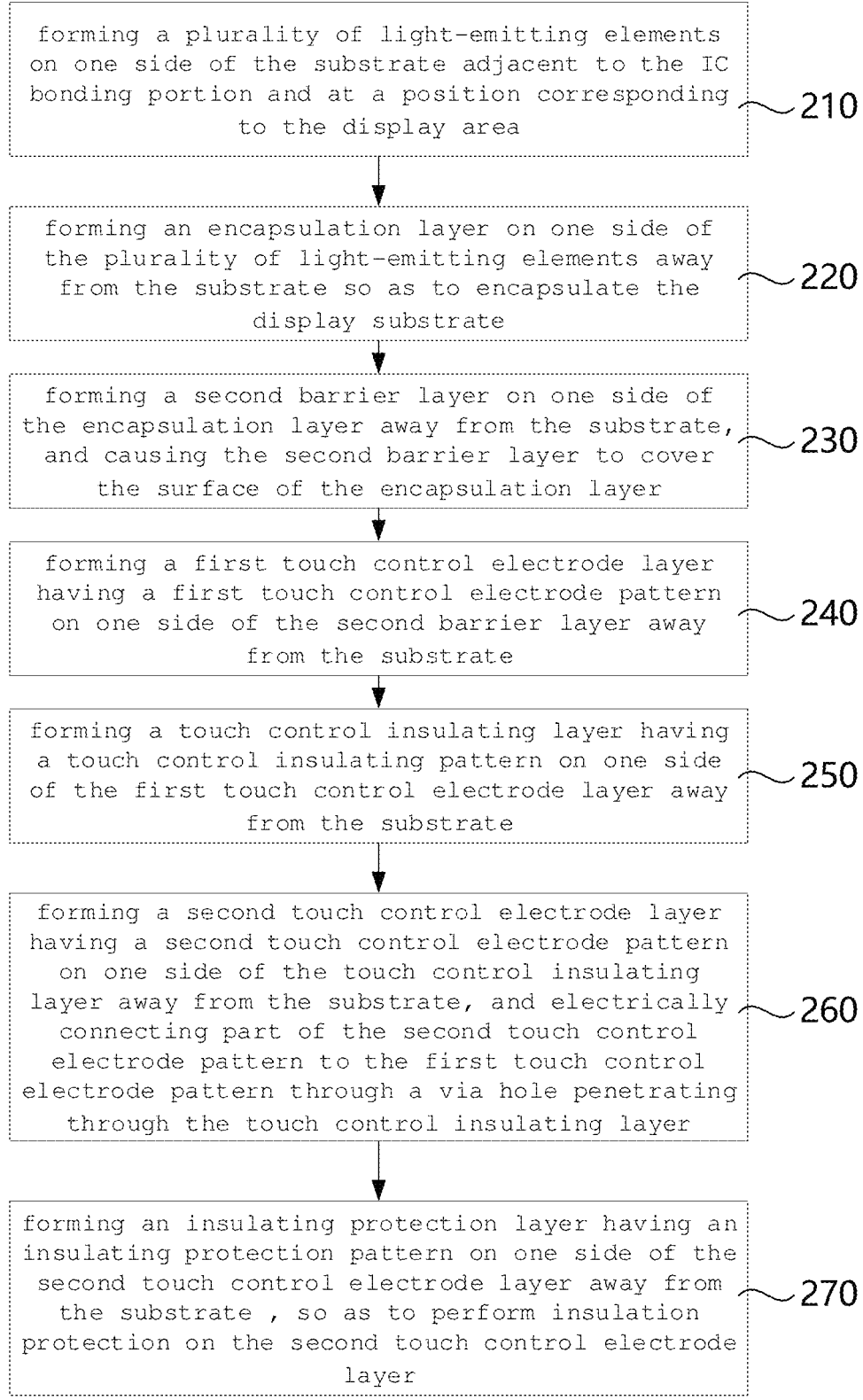
FIG. 5 is a schematic flowchart of forming a light-emitting element, an encapsulation layer and a touch control structure in an embodiment of a manufacturing method of a display panel according to the present disclosure.

FIG. 5 is a schematic flowchart of forming a light-emitting element, an encapsulation layer and a touch control structure in an embodiment of a manufacturing method of a display panel according to the present disclosure.

Referring to FIG. 5, in some embodiments, the step of forming the display substrate 1 further includes steps 210 and 220. In step 210, a plurality of light-emitting elements 15 are formed on one side of the substrate 10 adjacent to the IC bonding portion 20 and at a position corresponding to the display area 10A. In step 220, an encapsulation layer 19 is formed on one side of the plurality of light-emitting elements 15 away from the substrate 10 so as to encapsulate the display substrate 1.

In some embodiments, the manufacturing method of the display panel further includes: forming a touch control structure 30 on one side of the encapsulation layer 19 away from the substrate 10. The touch control structure 30 may be formed by an FMLOC process. Referring to FIG. 5, the step of forming the touch control structure 30 may include steps 230 to 270. In step 230, a second barrier layer 31 is formed on one side of the encapsulation layer 19 away from the substrate 10, and the second barrier layer 31 is caused to cover the surface of the encapsulation layer 19.

In step 240, a first touch control electrode layer 32 having a first touch control electrode pattern is formed on one side of the second barrier layer 31 away from the substrate 10. In step 250, a touch control insulating layer 33 having a touch control insulating pattern is formed on one side of the first touch control electrode layer 32 away from the substrate 10.

In step 260, a second touch control electrode layer 34 having a second touch control electrode pattern is formed on one side of the touch control insulating layer 33 away from the substrate 10, and part of the second touch control electrode pattern is electrically connected to the first touch control electrode pattern through a via hole penetrating through the touch control insulating layer 33. In step 270, an insulating protection layer 35 having an insulating protection pattern is formed on one side of the second touch control electrode layer 34 away from the substrate 10, so as to perform insulation protection on the second touch control electrode layer 34.

In the above-described embodiments, the second barrier layer 31 and the first barrier layer 23 are formed by the same patterning process, and the second touch control electrode layer 34 and the first metal layer 24 are formed by the same patterning process. This is conductive to simplifying the process. In other embodiments, the touch control insulating layer 33 and the first barrier layer 23 are formed by the same patterning process, which is conductive to simplifying the process.

In the above-described steps 240 to 270, the first touch control electrode pattern, the second touch control electrode pattern, the touch insulation pattern and the insulation protection pattern may be formed by a photo mask process respectively. In other embodiments, these patterns may also be formed by a chemical vapor deposition (simply referred to as CVD) process.

A plurality of embodiments in the present description are described in a progressive manner with different focuses respectively. Cross-reference may be made for the same or similar parts between the respective embodiments. For the embodiments of the method, since the method as a whole and the steps involved therein are in a relationship corresponding to the content in the embodiments of the display panel, such embodiments are described in a relatively simple manner. For the relevant aspects, reference may be made to some of the descriptions of the embodiments of the display panel.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration but not for limiting the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display panel, comprising:
    a display substrate having a display area and a non-display area surrounding the display area, wherein the display substrate comprises a substrate and an integrated circuit bonding portion arranged on one side of the substrate and located in the non-display area, and wherein the integrated circuit bonding portion comprises:
    a pin;
    a first passivation layer located on one side of the substrate adjacent to the pin, covering a peripheral area of the pin, and exposing a central area of the pin;
    a first barrier layer located on one side of the first passivation layer away from the substrate and covering the first passivation layer and an edge of the first passivation layer connected to the pin;
    a first metal layer located on one side of the first barrier layer away from the substrate, at least covering a central portion of the pin, and electrically connected to the pin; and
    a touch control structure at least located in the display area of the display substrate;
    wherein the display substrate further comprises:
        a plurality of light-emitting elements arranged on one side of the substrate adjacent to the integrated circuit bonding portion and located in the display area; and
        an encapsulation layer located between the plurality of light-emitting elements and the touch control structure, and configured to encapsulate the display substrate.

2. The display panel according to claim 1, further comprising:
    an integrated circuit chip having a chip base pin, wherein the integrated circuit chip is located on one side of the first metal layer away from the substrate; and
    a conductive adhesive film located between the chip base pin of the integrated circuit chip and the first metal layer, and electrically connected to the chip base pin of the integrated circuit chip and the first metal layer.

3. The display panel according to claim 1, wherein the touch control structure comprises:
    a second barrier layer located on one side of the encapsulation layer away from the substrate and covering a surface of the encapsulation layer.

4. The display panel according to claim 1, wherein the touch control structure further comprises:
    a first touch control electrode layer having a first touch control electrode pattern and located on one side of the second barrier layer away from the substrate;
    a touch control insulating layer having a touch control insulating pattern and located on one side of the first touch control electrode layer away from the substrate; and
    a second touch control electrode layer having a second touch control electrode pattern and located on one side of the touch control insulating layer away from the substrate, wherein part of the second touch control electrode pattern is electrically connected to the first touch control electrode pattern through a via hole penetrating through the touch control insulating layer.

5. The display panel according to claim 4, wherein the touch control structure further comprises:
    an insulating protection layer having an insulating protection pattern, and located on one side of the second touch control electrode layer away from the substrate, and configured to perform insulation protection on the second touch control electrode layer.

6. The display panel according to claim 3, wherein the second barrier layer and the first barrier layer are located in the same layer and formed of the same material.

7. The display panel according to claim 4, wherein the touch control insulating layer and the first barrier layer are located in the same layer and formed of the same material, and the second touch control electrode layer and the first metal layer are located in the same layer and formed of the same material.

8. The display panel according to claim 1, wherein the display substrate further comprises:
    a first insulating layer located between the first passivation layer and the substrate; and
    a second insulating layer located between the first insulating layer and the first passivation layer,
    wherein the pin comprises:
    a first pin metal layer located on a surface of one side of the first insulating layer away from the substrate, and partially covered by the second insulating layer.

9. The display panel according to claim 8, wherein the display substrate further comprises:
    a third insulating layer located between the second insulating layer and the first passivation layer,
    wherein the pin further comprises:
    a second pin metal layer located on a surface of one side of the third insulating layer away from the substrate, and electrically connected to the first pin metal layer through a via hole penetrating through the second insulating layer and the third insulating layer, wherein the second pin metal layer is also electrically connected to the first metal layer.

10. The display panel according to claim 9, wherein the display substrate further comprises:
    a thin film transistor device comprising an active layer, a gate, a source and a drain, wherein the active layer is located between the first insulating layer and the substrate, the gate is located on a surface of one side of the first insulating layer away from the substrate, and the source and the drain are located on a surface of one side of the third insulating layer away from the substrate, and electrically connected to the active layer through via holes penetrating through the first insulating layer, the second insulating layer and the third insulating layer respectively; and
    a capacitor device comprising a first capacitor electrode plate and a second capacitor electrode plate, wherein the first capacitor electrode plate is located on a surface of one side of the first insulating layer away from the substrate, and the second capacitor electrode plate is located on a surface of one side of the second insulating layer away from the substrate;

wherein the gate, the first capacitor electrode plate and the first pin metal layer are located in the same layer and formed of the same material, and the source, the drain and the second pin metal layer are located in the same layer and formed of the same material.

11. The display panel according to claim 10, wherein the display substrate further comprises:

a second passivation layer located on one side of the third insulating layer away from the substrate and covering the source and the drain; and a planarization layer located on one side of the second passivation layer away from the substrate, wherein the plurality of light-emitting elements are located between the planarization layer and the encapsulation layer, and the second passivation layer and the first passivation layer are located in the same layer and formed of the same material.

12. A display device, comprising:

the display panel according to claim 1.

13. A manufacturing method of the display panel according to claim 1, comprising:

forming a display substrate having a display area and a non-display area surrounding the display area, wherein the display substrate comprises a substrate and an integrated circuit bonding portion formed on one side of the substrate and located in the non-display area, wherein a step of forming the integrated circuit bonding portion comprises:

forming a pin on one side of the substrate;

forming a first passivation layer on one side of the substrate adjacent to the pin and causing the first passivation layer to cover a peripheral area of the pin, and to expose a central area of the pin;

forming a first barrier layer on one side of the first passivation layer away from the substrate, and causing the first barrier layer to cover the first passivation layer and an edge of the first passivation layer connected to the pin; and forming a first metal layer on one side of the first barrier layer away from the substrate, and causing the first metal layer to at least cover a central portion of the pin and to electrically connect the pin.

14. The manufacturing method of the display panel according to claim 13, wherein the manufacturing method further comprises between the step of forming the first passivation layer and the step of forming the first barrier layer:

forming a planarization layer on one side of the first passivation layer away from the substrate; and removing at least a portion of the planarization layer corresponding to the pin.

\* \* \* \* \*

UNITED STATES PATENT AND TRADEMARK OFFICE
CERTIFICATE OF CORRECTION

| | | |
|---|---|---|
| PATENT NO. | : 12,336,413 B2 | Page 1 of 1 |
| APPLICATION NO. | : 17/786391 | |
| DATED | : June 17, 2025 | |
| INVENTOR(S) | : Ping Wen | |

It is certified that error appears in the above-identified patent and that said Letters Patent is hereby corrected as shown below:

On the Title Page

Column 2, item (56) U.S. Patent Documents, Line 2, delete "Ku et al." and insert -- Xu et al. --

In the Specification

Column 1, Lines 10-11, delete "China-Chinese" and insert -- Chinese --

Signed and Sealed this
Fifth Day of August, 2025

Coke Morgan Stewart
*Acting Director of the United States Patent and Trademark Office*